United States Patent

Motte et al.

(10) Patent No.: US 7,551,238 B2
(45) Date of Patent: Jun. 23, 2009

(54) INTEGRATED TUNER

(75) Inventors: Bruno Pierre Jean-Marie Motte, Bénouville (FR); Robbert Peter Fortuin, Eindhoven (NL)

(73) Assignee: NXP B.V., Eindhoven (NL)

( * ) Notice: Subject to any disclaimer, the term of this patent is extended or adjusted under 35 U.S.C. 154(b) by 576 days.

(21) Appl. No.: 10/550,348

(22) PCT Filed: Mar. 22, 2004

(86) PCT No.: PCT/IB2004/050306

§ 371 (c)(1),
(2), (4) Date: Sep. 23, 2005

(87) PCT Pub. No.: WO2004/086757

PCT Pub. Date: Oct. 7, 2004

(65) Prior Publication Data

US 2006/0232715 A1    Oct. 19, 2006

(30) Foreign Application Priority Data

Mar. 28, 2003  (EP)  ................................. 03290802

(51) Int. Cl.
*H04N 5/50* (2006.01)
(52) U.S. Cl. ...................... 348/731; 348/528; 348/725; 455/234.1
(58) Field of Classification Search ................. 348/731, 348/528, 732, 733, 678, 682, 683, 684, 685; 455/232.1, 234.1, 245.1, 136, 138, 177.1, 455/200.1; 375/345
See application file for complete search history.

(56) References Cited

U.S. PATENT DOCUMENTS 5,617,137 A * 4/1997 Whitlow ...................... 348/193
2006/0044468 A1 * 3/2006 Chowdhury et al. ......... 348/465

FOREIGN PATENT DOCUMENTS

JP    11164226 A  *  6/1999

* cited by examiner

*Primary Examiner*—M. Lee

(57) ABSTRACT

An integrated tuner comprises a step AGC amplifier (1) that is adjusted only during a vertical synchronization interval. A receiver comprises such an integrated tuner and an IF demodulation circuit (5,6) for providing a vertical sync signal to the integrated tuner.

8 Claims, 1 Drawing Sheet

INTEGRATED TUNER

This application is a national stage of PCT/IB2004/050306 having an international filing date of Mar. 22, 2004 and claims priority from EP application 0320802.2 filed Mar. 28, 2003, the contents of which are hereby incorporated by reference in its entirety.

The invention relates to an integrated tuner having an automatic gain control (AGC) circuit, and to a receiver comprising such an integrated tuner.

Tuners for TV or data reception have AGC circuitry to handle input signals with different levels, which can change during time. Variable gain stages are commonly used in tuners. These circuits are applied in the RF domain and IF domain as well. To have the best signal to noise ratio at the output of the tuner, the AGC preamplifier stage in the tuner should have a well-defined gain at every input signal level. Very often the gain setting is a trade off between noise and distortion within the limits of the specification of the specific application.

Normally in TV tuners continuous AGC circuitry is used. In case of gain changes no influences on the screen can be seen. Continuous AGC circuitry is always equipped with a MOSFET. There is of course an economic reason to integrate this AGC function into the mixer/oscillator IC of the tuner. When integrated, a continuous AGC circuitry using a Gilbert cell causes undesired noise and intermodulation during automatic gain control.

It is, inter alia, an object of the invention to provide an improved integrated tuner. To this end, the invention provides a tuner as defined in the independent claims. Advantageous embodiments are defined in the dependent claims.

In accordance with the present invention, an integrated tuner comprises a step AGC amplifier that is adjusted only during a vertical synchronization interval. A receiver comprises such an integrated tuner and an IF demodulation circuit for providing a vertical sync signal to the integrated tuner. Advantageously, in a step AGC amplifier using resistors in feedforward and feedback paths around an operational amplifier structure, at large input signals amplification is reduced and feedback is increased, which results in a good intermodulation distance.

These and other aspects of the invention will be apparent from and elucidated with reference to the embodiments described hereinafter.

IN THE DRAWINGS

Figure 1:
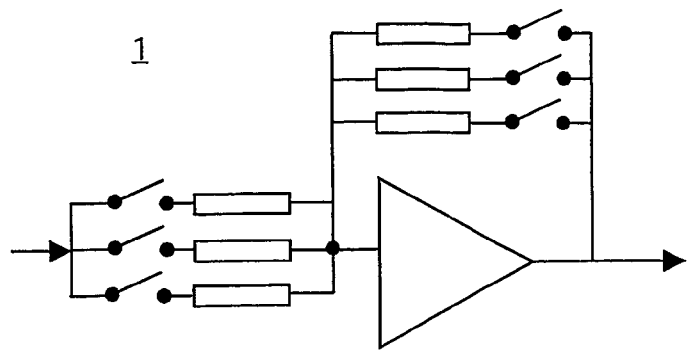
FIG. 1 shows an embodiment of a step AGC amplifier.

In this invention, a step AGC amplifier 1 is used. The several gain settings are realized by choosing the ratio of resistors in a circuit with an inverting amplifier. See FIG. 1. The AGC amplifier 1 is situated at an input of a tuner. By means of an AGC detector 9 the gain should be adjusted such that no overloading or too much intermodulation will occur. The picture quality is suffering strongly during gain changes due to the fact that the AGC amplifier 1 in the tuner has discrete steps. To have no visible interference in the picture, the gain changes should be outside the visible area on the TV screen. In this proposal there is chosen for AGC steps during the vertical synchronization period. An embodiment of the invention as described in FIG. 2 also includes a solution to define the number of steps during the vertical synchronization interval.

Figure 2:
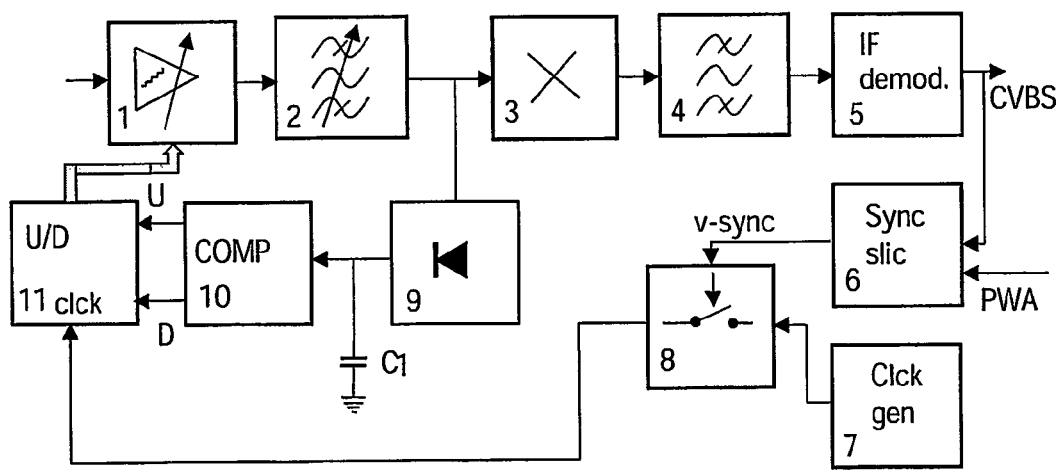
FIG. 2 shows an embodiment of a receiver comprising a tuner in accordance with the present invention.

In FIG. 2, variable gain amplifier 1 has discrete gain steps. The gain variation can be e.g. 0.1, 0.5 or 1 dB per step. The gain can be made e.g. by a ratio of resistors. When switching between resistors, the gain will change. Controllable selectivity filter 2 provides selectivity in the tuner to suppress unwanted frequencies such as image frequencies and signals with high levels. A mixer 3 shifts the wanted signal to an Intermediate Frequency (IF) which could be e.g. 38.9, 45.75, 56.75 MHz. The mixer 3 will be driven by an oscillator, which is not drawn in the block diagram. The principle proposed is not exclusive for standard IF. It is also applicable for up-conversion or conversion to low or zero IF. A SAW filter 4 provides channel selectivity. This filter 4 is necessary to suppress neighbor channels and this filter makes a Nyquist slope for proper demodulation of analog TV signals. For low or zero IF other kind of filters are used. An IF demodulator 5 demodulates the IF signal to base-band CVBS signal. The IF demodulator 5 has an internal AGC circuitry to handle different IF input levels with a constant CVBS output level of 1 Vpp. Alternatively, a digital IF demodulator for analog transmissions can be used. A synchronization slicer 6 separates the vertical synchronization pulse v-sync from the CVBS signal. This slicer 6 can be made of a so-called H/V PLL circuitry, which locks on the synchronization signals of the CVBS signal. In this proposal, the pulse width of the v-sync is adjustable, for which purpose the slicer 6 receives a pulse width adjustment signal PWA. A clock generator 7 is used for the up-down counter. The frequency of the clock generator will control the number of AGC steps during the pulse width of the v-sync signal. Therefore the gate connects the clock generator 7 with up-down counter 11 only during the pulse width of the vertical synchronization pulse. A level detector 9 measures the level of the output of the AGC amplifier 1. The detector 9 could be a RMS or peak detector. Low pass filtering is made by the use of capacitor C1. That means that the voltage on C1 is always a reflection of the total output level of the AGC amplifier 1. A dual comparator 10 measures the voltage across a capacitor C1. It has three ranges: too low, too high and a range in the middle. It decides whether the voltage, which is a reflection of the input level, of the capacitor C1 is to high, to low or in the middle. The outputs "up" and "down" will control the direction of the counter 11 when the clock is active. An up-down counter 10 controls the switches in the AGC amplifier 1. The counter counts up or down depending on the output of the dual comparator 10. It counts when the clock signal is received from the clock generator via the gate. IF demodulator 5 and sync slicer 6 may be in an IF IC, while the other items shown in FIG. 2 may be in a tuner IC.

The AGC amplifier 1 amplifies the total signal from an antenna input. The selectivity filter 2 filters out the wanted channel and has to suppress unwanted channels such as image frequency and strong far away channels. The output signal is mixed to IF and filtered by the channel filter 4. The output signal is then demodulated by the IF demodulator 5. The output signal of the IF demodulator 5 is the CVBS signal. The synchronization slicer 6 separates the vertical synchronization signal from this CVBS signal. The width of the vertical synchronization pulse at the output of the slicer 6 can be adjusted to control the number of clock pulses going from the clock generator 7 to the up-down counter 11. That means that only during the vertical synchronization output pulse period of the sync slicer 6, the AGC amplifier 1 can change a certain number of steps. The number of steps can be controlled by e.g. an I2C bus via setting of the pulse width or frequency of the clock generator 7. With this adjustment a customer can influence the speed of AGC change or the extent of interference caused by gain changes.

In this preferred embodiment of the AGC system, in contradistinction to other AGC systems in TV where the input signal of the level detector is gated, the detector should work continuously to measure a total power of all signals in all channels applied to the AGC amplifier 1, while adjustment is only done during the vertical synchronization interval to have no visible interference in the picture. At capacitor C1 always the detected voltage is present and will reflect the output level of the AGC amplifier. The dual comparator 10 has always the information whether the output voltage of the AGC amplifier 1 is too high, too low or in the middle. That means that the counter 11 should count up, down or there will be no change. This will happen when the clock signal is active at the input of the up-down counter.

The invention provides the following advantages. Solution on system level to avoid disturbances in the TV picture during step AGC. Flexibility to change the number of steps during vertical synchronization interval. Due to the given solution, now it is possible to integrate the AGC function into an IC for tuner application.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An integrated tuner comprising: a step Automatic Gain Control (AGC) amplifier; and means for adjusting the step AGC amplifier (1) only during a vertical synchronization interval, wherein the adjusting means comprise: a clock generator for generating clock pulses; an up/down counter for generating control signals to adjust the step AGC amplifier; means for passing said clock pulses to said up/down counter only during said vertical synchronization interval.

2. An integrated tuner as claimed in claim 1, wherein the adjusting means further comprise: a level detector coupled to an output of the step AGC amplifier; and a dual comparator coupled to an output of said level detector to provide up/down control signals to said up/down counter in dependence on an output signal of said level detector.

3. An integrated tuner as claimed in claim 2, wherein the level detector continuously measures a total power of all signals in all channels applied to the step AGC amplifier.

4. An integrated tuner comprising:
a step Automatic Gain Control (AGC) amplifier;
a synchronization slicer for separating a vertical synchronization signal from a Composite Video Broadcast Signal (CVBS) signal;
means for adjusting the step AGC amplifier only during a vertical synchronization interval output pulse period of the synchronization slicer;
wherein a width of the vertical synchronization signal output from the synchronization slicer is adjusted to control a number of pulses output to the means for adjusting the AGC amplifier.

5. An integrated tuner as claimed in claim 4, wherein the adjusting means comprise: a clock generator for generating clock pulses; an up/down counter for generating control signals to adjust the step AGC amplifier; means for passing said clock pulses to said up/down counter only during said vertical synchronization interval.

6. An integrated tuner as claimed in claim 5, wherein the adjusting means further comprise: a level detector coupled to an output of the step AGC amplifier; and a dual comparator coupled to an output of said level detector to provide up/down control signals to said up/down counter in dependence on an output signal of said level detector.

7. An integrated tuner as claimed in claim 6, wherein the level detector continuously measures a total power of all signals in all channels applied to the step AGC amplifier.

8. A receiver comprising: an integrated tuner as claimed in claim 4; and an IF demodulation circuit for providing a vertical sync signal to the integrated tuner.

* * * * *